United States Patent [19]

Maa et al.

[11] Patent Number: 4,547,261

[45] Date of Patent: Oct. 15, 1985

[54] ANISOTROPIC ETCHING OF ALUMINUM

[75] Inventors: Jer-shen Maa, Plainsboro, N.J.; Bernard Halon, Kings County, N.Y.

[73] Assignee: RCA Corporation, Princeton, N.J.

[21] Appl. No.: 655,692

[22] Filed: Sep. 28, 1984

[51] Int. Cl.[4] .......................... C23F 1/00; B44C 1/22; C03C 15/00; C03C 25/06

[52] U.S. Cl. .................... 156/643; 156/646; 156/656; 156/659.1; 156/665; 204/192 E; 252/79.1

[58] Field of Search .............. 252/79.1; 156/643, 646, 156/652, 656, 659.1, 665; 204/164, 192 E, 192 EC; 427/38, 39; 430/318

[56] References Cited

U.S. PATENT DOCUMENTS

| | | | |
|---|---|---|---|
| 4,267,013 | 5/1981 | Iida et al. | 156/643 |
| 4,350,563 | 9/1982 | Takada et al. | 156/643 |
| 4,370,195 | 1/1983 | Halon et al. | 156/643 |
| 4,370,196 | 1/1983 | Vossen, Jr. et al. | 156/643 |
| 4,372,807 | 2/1983 | Vossen, Jr. et al. | 156/643 |
| 4,412,885 | 10/1983 | Wang et al. | 156/643 |
| 4,419,201 | 12/1983 | Levinstein et al. | 204/192 E |
| 4,444,618 | 4/1984 | Saia et al. | 156/643 |

OTHER PUBLICATIONS

Kammerdiner, Solid State Technology, pp. 79-85, Oct. 1981.
Reichelderfer, Solid State Technology, pp. 160-165, Apr. 1982.
Sato et al., J. Electrochem. Soc., vol. 129, No. 11, pp. 2522-2527, Nov. 1982.
Maa et al., J. Vac. Sci. & Tech. A vol. 1, No. 2, pp. 636-637, Apr.-Jun. 1983.

*Primary Examiner*—William A. Powell
*Attorney, Agent, or Firm*—B. E. Morris; R. H. Swope

[57] ABSTRACT

An improved etchant gas composition for the plasma etching of a layer of aluminum or its alloys on a substrate is provided. The etchant composition comprises boron trichloride, nitrogen and a halogenated fluorocarbon. In addition to providing an efficient, anisotropic etch, the subject etchant compositions form a passivating coating on aluminum reactor walls, protecting them from being etched and substantially reducing contamination problems. The subject compositions etch aluminum/silicon alloys without leaving a residue of silicon "freckles" on the substrate surface.

8 Claims, No Drawings

ANISOTROPIC ETCHING OF ALUMINUM

This invention relates to the plasma etching of aluminum and its alloys. More particularly, this invention pertains to an improved etchant gas mixture for the anisotropic plasma etching of aluminum and its alloys.

BACKGROUND OF THE INVENTION

The increasing use of multilevel metallization in the fabrication of very large scale integrated circuits (VLSI), combined with the desire to reduce the geometries in such circuits, makes it essential that etching of aluminum metallization be anisotropic. Therefore, to be commercially attractive, any etchant gas mixture or process manipulation developed to alleviate a problem or problems commonly associated with the plasma etching of aluminum metallization must still possess the capacity to perform an efficient, anisotropic etch.

One such problem is the contamination caused by material or gases from the walls of the plasma reaction chamber. For aluminum etching, the plasma reaction chamber is generally made of aluminum to prevent cross-contamination. The chamber walls are conventionally protected against etching by a thick plasma-sprayed coating of aluminum oxide. This oxide coating, however, is porous and can absorb gases and water vapor from the reaction chamber, which are a source of contamination of the substrate being etched. In addition, since the aluminum oxide layer is generally rough, it is often difficult to remove material deposited thereon during an etching procedure which may be a source of contamination for subsequent procedures. These contamination problems affect both etch reproducibility and efficiency.

SUMMARY OF THE INVENTION

In accordance with this invention, an etchant gas mixture has been found which passivates the walls of an aluminum reaction chamber, thus minimizing contamination, and which produces an efficient, anisotropic etch of aluminum metallization. The subject etchant gas mixture comprises boron trichloride, nitrogen and a halogenated fluorocarbon.

DETAILED DESCRIPTION OF THE INVENTION

The term "aluminum metallization", as utilized herein, includes aluminum and alloys thereof with silicon or silicon and copper. The silicon content in such alloys is generally not in excess of about five percent by weight and, preferably, not in excess of about three percent by weight. Aluminum metallization, as used in the fabrication of semiconductor devices, is deposited as a thin layer which is then etched to create predetermined aluminum patterns.

The addition of a halogenated fluorocarbon to an etchant gas mixture of boron trichloride and nitrogen in accordance with this invention produces a passivating layer on the walls of the aluminum reaction chamber which is sufficient to protect the walls from being etched. This effect is achievable without loss of the anisotropic quality of the etch or other desirable qualities of the etchant mixture.

The passivating coating deposited onto the walls of the reaction chamber by the subject etchant mixtures may be substantially removed by reducing the amount of the halogenated fluorocarbon in the etchant mixture until an aluminum chlorine species is detected by optical emission technique in the chamber or by mass spectrascopic technique in the effluent. This is an indication that the passivating coating is no longer protecting the aluminum chamber walls. The formation and removal of the passivating coating likewise takes place on the upper electrode in a conventional parallel plate plasma etching system. This occurs because the etch rate on the upper electrode is substantially slower than on the lower or powered electrode. Although the chemical makeup of the passivating coating formed by the subject etchant mixtures is not known with certainty, it is assumed to be polymeric in nature.

The halogenated fluorocarbon component of the subject etchant mixtures is preferably a chlorofluoromethane such as trichlorofluoromethane, $CFCl_3$, dichlorodifluoromethane, $CF_2Cl_2$, and chlorotrifluoromethane, $CF_3Cl$. Although mixtures of two or more halogenated fluorocarbons can be utilized in the subject etchant mixtures, it is preferred that they be utilized individually because minor adjustments of operating parameters may be required with each one in order to obtain maximum results. For example, exceeding a certain flow rate with $CF_2Cl_2$ and $CF_3Cl$ will cause a sharp decline in the aluminum etch rate, other conditions remaining constant. The aluminum etch rate using $CFCl_3$, however, will remain relatively constant over a much greater range of flow rates. For example, under constant conditions of 350 v, 35 mtorr, 20 sccm of boron trichloride and 20 sccm of nitrogen, the etch rate of $CF_3Cl$ will remain relatively uniform over a flow range of form about 13 to about 30 sccm. The decline in etch rate in each instance is the result of an increase in the formation of the passivating coating produced by the increased halogenated fluorocarbon flow into the chamber.

The subject etchant mixtures are comprised, on a volume basis, of from about 25 to about 46, preferably from about 30 to about 44, percent of boron trichloride, from about 25 to about 46, preferably from about 30 to about 44, percent of nitrogen and from about 8 to about 50, preferably from about 12 to about 40, percent of the halogenated fluorocarbon.

The etching conditions utilized in accordance with this invention are generally those conventionally utilized with etchant mixtures containing boron trichloride. The apparatus is likewise conventional. Preferably, aluminum metallization is etched in accordance with this invention in a planar reactor such as described by Vossen in an article entitled, "Plasma Deposition and Etching Reactors for Semiconductor Applications" in Pure & Appl. Chem. Vol. 52, pp. 1759–1765, 1980. In such reactors, the upper electrode can be powered or grounded and the lower electrode turned to between 150 and 400 volts with respect to ground. The total gas pressure utilized is typically about 35 mtorr and the total gas flow is from about 40 to 100 sccm. None of these parameters is particularly critical.

It will be appreciated by those of ordinary skill in this art that the above parameters are given with reference to the system described in the Vossen article and that the geometry of a plasma system has an effect on its plasma potential. Therefore, the above parameters may be varied depending on the system being utilized. The parameters for pressure, gas flow and the like which would be equivalent to those given above for variations in the plasma system utilized are considered to be within the skill of the art.

In general, the induction time, i.e. the time required to remove the layer of passivating oxide typically present on the surface of a layer of aluminum metallization, will increase with an increase in the flow rate of any of the halogenated fluorocarbons in the subject etch mixtures. The increase is significantly more pronounced using $CF_3Cl$ than $CF_2Cl_2$ or $CFCl_3$. The induction period for all of the halogenated fluorocarbons will also decrease with increases in the bias voltage of the lower electrode in a system such as described by Vossen. In the case of trichlorofluoromethane, the shortest induction period is obtained at a voltage higher than that at which the maximum etch rate is obtained. Therefore, it is preferred to lower the voltage after etching has commenced, i.e. after the induction period is completed.

The advantages of the subject compositions are significant. Most important, the subject compositions produce an excellent anisotropic etch of aluminum metallization with no undercut. The subject compositions provide protection for the walls of an aluminum reaction chamber and upper electrode without extra processing steps. The subject etch mixtures possess enhanced ion energies and an increased etch rate in comparison with conventional boron trichloride-containing etch mixtures. Further, the subject etch mixtures readily remove the layer of native oxide from the surface of aluminum metallization without the need to change etch compositions.

In addition to the above-named advantages, the subject compositions unexpectedly eliminate the need for a separate procedure to remove the residue of silicon "freckles" which often remain on the substrate surface after etching of a layer of aluminum/silicon alloy. Heretofore, this residue has been removed by dipping the substrate in a dilute HF solution, preferably with ultrasonic vibration. Since aluminum/silicon alloys are frequently used in semiconductor device fabrication, the benefits of eliminating an extra step to remove this residue are readily apparent.

The following Examples further illustrate this invention, it being understood that the invention is in no way intended to be limited to the details described therein. In the Examples, all parts and percentages are on a volume basis and all temperatures are in degrees Celsius, unless otherwise stated.

EXAMPLE 1

A series of silicon wafers coated with an one micrometer thick layer of aluminum was utilized as substrates. The wafers were overcoated with a finely patterned resist layer. The wafers were placed into a parallel electrode etching reactor having aluminum walls. The upper electrode was grounded and the lower (substrate) electrode was tuned to produce a voltage to ground of $-350$ volts. The pressure was 35 mtorr. The gas flow was 55 sccm which was comprised of about 36.5 percent of boron trichloride, about 36.5 percent of nitrogen and about 27 percent of trichlorofluoromethane. The induction period required for removing the oxide coating on the surface of the aluminum layer was approximately two minutes. The power was then lowered so that the substrate electrode was tuned to $-300$ volts. Etching was carried out over four minutes. The etch rate was between 3000 and 4000 angstroms per minute. Examination of the substrate after removal of the resist showed the aluminum etch to be anisotropic with line width loss estimated to be less than five percent.

The presence of the passivating coating formed on the walls of the reaction chamber by the subject etchant composition was demonstrated by the complete disappearance of AlCl ion species emission after etching was completed. The plasma was continued without a substrate in the chamber and utilizing an etchant mixture of only boron trichloride and nitrogen. AlCl ion species appeared in the optical emission spectrum within 30 seconds. The reappearance of AlCl indicates that the passivating coating has been removed and etching of the reaction chamber walls has begun.

EXAMPLE 2

In the manner of Example 1, substrates were etched with a mixture of about 40 percent of boron trichloride, about 40 percent of nitrogen and about 20 percent of dichlorodifluoromethane. The power was maintained at $-350$ throughout the etching period. The total gas flow was 50 sccm and etching was carried out for 6.5 minutes. An anisotropic etch comparable to that of Example 1 was obtained.

EXAMPLE 3

In the manner of Example 1, substrates were etched with a mixture of about 43.5 percent of boron trichloride, about 43.5 percent of nitrogen and about 13 percent of chlorotrifluoromethane. The power was maintained at $-350$ throughout the etching period. The total gas flow was 46 sccm and etching was carried out for 10 minutes. An anisotropic etch comparable to that of Example 1 was obtained.

EXAMPLE 4

Substrates coated with a one micrometer thick layer of aluminum containing about one percent by weight of silicon were etched in accordance with the procedure of Example 1 using an etch mixture of boron trichloride, nitrogen and trichlorofluoromethane in the proportion given therein. After etching was completed, the substrates were examined microscopically. The portion of the substrate exposed by the etch was found to be substantially free of silicon "freckles".

We claim:

1. A gaseous etchant composition for aluminum and its alloys comprising boron trichloride, nitrogen and a halogenated fluorocarbon.

2. An etchant composition in accordance with claim 1, wherein the halogenated fluorocarbon is selected from the group consisting of chlorotrifluoromethane, dichlorodifluoromethane and trichlorofluoromethane.

3. An etchant composition in accordance with claim 2, wherein said halogenated fluorocarbon is chlorotrifluoromethane.

4. An etchant composition in accordance with claim 2, wherein said halogenated fluorocarbon is dichlorodifluoromethane.

5. An etchant composition in accordance with claim 2, wherein said halogenated fluorocarbon is trichlorofluoromethane.

6. An etchant composition in accordance with claim 1, wherein said composition contains, on a volume basis, from about 25 to about 46 percent of boron trichloride, from about 25 to about 46 percent of nitrogen and from about 8 to about 50 percent of the halogenated fluorocarbon.

7. In a process of plasma etching aluminum or an alloy thereof on a substrate with an etchant gas, the improvement comprising utilizing as the etchant gas a mixture of boron trichloride, nitrogen and a halogenated fluorocarbon.

8. A process in accordance with claim 7, wherein the halogenated fluorocarbon is selected from the group consisting of chlorotrifluoromethane, dichlorodifluoromethane and trichlorofluoromethane.

* * * * *